(12) United States Patent     (10) Patent No.:   US 12,603,479 B2

Terao et al.     (45) Date of Patent:    Apr. 14, 2026

(54) METHOD OF MANUFACTURING VERTICAL-CAVITY SURFACE-EMITTING LASER ELEMENT

(71) Applicant: NICHIA CORPORATION, Anan (JP)

(72) Inventors: Kenichi Terao, Tokushima (JP); Hitoshi Takayama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 396 days.

(21) Appl. No.: 18/497,397

(22) Filed: Oct. 30, 2023

(65) Prior Publication Data

US 2024/0146025 A1     May 2, 2024

(30) Foreign Application Priority Data

Oct. 31, 2022    (JP) .................................. 2022-174498

(51) Int. Cl.
*H01S 5/183*       (2006.01)
*H01S 5/343*       (2006.01)

(52) U.S. Cl.
CPC ....... *H01S 5/18311* (2013.01); *H01S 5/34333* (2013.01); *H01S 5/34346* (2013.01)

(58) Field of Classification Search
None
See application file for complete search history.

(56) References Cited

U.S. PATENT DOCUMENTS

| | | | |
|---|---|---|---|
| 6,242,761 B1 | 6/2001 | Fujimoto et al. | |
| 7,420,999 B2 * | 9/2008 | Masui ................. | H01S 5/34333 |
| | | | 372/43.01 |
| 2002/0146866 A1 | 10/2002 | Nomura et al. | |
| 2004/0057486 A1 | 3/2004 | Watanabe | |
| 2004/0057487 A1 | 3/2004 | Nomura et al. | |
| 2004/0079994 A1 | 4/2004 | Ueda | |
| 2009/0273003 A1 | 11/2009 | Park | |
| 2019/0267774 A1 | 8/2019 | Sato et al. | |
| 2020/0244043 A1 | 7/2020 | Kawashima | |

FOREIGN PATENT DOCUMENTS

| | | |
|---|---|---|
| JP | H10-294531 A | 11/1998 |
| JP | 2002-289976 A | 10/2002 |
| JP | 2002-305353 A | 10/2002 |
| JP | 2003-163417 A | 6/2003 |

(Continued)

*Primary Examiner* — Suberr L Chi

(74) *Attorney, Agent, or Firm* — Spencer Fane LLP

(57) ABSTRACT

A method of manufacturing a vertical-cavity surface-emitting laser element includes: providing a nitride semiconductor layer including an n-side semiconductor layer, an active layer, and a p-side semiconductor layer in this order; covering at least a first portion of a surface of the p-side semiconductor layer with a mask member while a second portion of the surface of the p-side semiconductor layer is not covered with the mask member; forming an oxide film on the second portion of the surface of the p-side semiconductor layer and the mask member; heat-treating the nitride semiconductor layer and the oxide film; removing the oxide film and the mask member after the heat-treating of the nitride semiconductor layer and the oxide film; and forming an electrode extending over the first portion and the second portion of the surface of the p-side semiconductor layer.

14 Claims, 8 Drawing Sheets

(56)     References Cited

FOREIGN PATENT DOCUMENTS

| | | | |
|---|---|---|---|
| JP | 2003-283052 | A | 10/2003 |
| JP | 2004-095650 | A | 3/2004 |
| JP | 2004-111853 | A | 4/2004 |
| JP | 2007-150371 | A | 6/2007 |
| JP | 2007-184644 | A | 7/2007 |
| JP | 2008-177615 | A | 7/2008 |
| JP | 2011-519484 | A | 7/2011 |
| JP | 2020-120051 | A | 8/2020 |
| WO | 2018/083877 | A1 | 5/2018 |

\* cited by examiner

METHOD OF MANUFACTURING VERTICAL-CAVITY SURFACE-EMITTING LASER ELEMENT

CROSS-REFERENCE TO RELATED APPLICATION

This application claims priority to Japanese Patent Application No. 2022-174498 filed on Oct. 31, 2022, the disclosure of which is hereby incorporated herein by reference in its entirety.

BACKGROUND

The present disclosure relates to a method of manufacturing a vertical-cavity surface-emitting laser element.

Laser elements that use nitride semiconductors and function as vertical-cavity surface-emitting lasers have been studied. For example, PCT Publication No. WO2018/083877 discloses that an insulating film having an opening is formed on a surface of a p-side semiconductor layer of a semiconductor layered body and that the opening defines a current injection region of a surface-emitting laser element. It is also disclosed that a current non-injection region is formed using plasma irradiation, an ashing treatment, a reactive ion etching treatment, or the like.

SUMMARY

However, for any of current confinement structures described above, further improvement in the insulating properties and the resulting improvement in the reliability of the vertical-cavity surface-emitting laser elements are required.

According to the present disclosure, a method of manufacturing a vertical-cavity surface-emitting laser element includes: providing a nitride semiconductor layer including an n-side semiconductor layer, an active layer, and a p-side semiconductor layer in this order; covering at least a first portion of a surface of the p-side semiconductor layer with a mask member while a second portion of the surface of the p-side semiconductor layer is not covered with the mask member; forming an oxide film on the second portion of the surface of the p-side semiconductor layer and the mask member; heat-treating the nitride semiconductor layer and the oxide film; removing the oxide film and the mask member after the heat-treating of the nitride semiconductor layer and the oxide film; and forming an electrode extending over the first portion and the second portion of the surface of the p-side semiconductor layer.

The method of manufacturing a vertical-cavity surface-emitting laser element in the present disclosure allows for providing a method of manufacturing a vertical-cavity surface-emitting laser element that shows further improved reliability.

DETAILED DESCRIPTION

Certain embodiments in the present disclosure will be described below with reference to the accompanying drawings as appropriate. The embodiments described below are intended to give a concrete form to the technical idea in the present disclosure. The present disclosure is not limited to the embodiments below unless specifically stated otherwise. Constitutions described in one embodiment or example may be applicable to other embodiments or examples. Sizes, thicknesses, or positional relationships of components illustrated in each drawing may be exaggerated in order to clarify the descriptions.

In the present specification, as for a nitride semiconductor layered body constituting a vertical-cavity surface-emitting laser element, a direction from an n-side semiconductor layer to a p-side semiconductor layer is referred to as an upward direction.

A method of manufacturing a vertical-cavity surface-emitting laser element of one embodiment of the present disclosure includes providing a nitride semiconductor layer including an n-side semiconductor layer, an active layer, and a p-side semiconductor layer layered in this order, covering at least a portion of a surface of the p-side semiconductor layer with a mask member, forming an oxide film on the surface of the p-side semiconductor layer over the mask member, heat-treating the nitride semiconductor layer including the oxide film, removing the oxide film and the mask member that are heat-treated, and forming an electrode extending over the portion of the surface of the p-side semiconductor layer having been covered with the mask member and a portion of the surface of the p-side semiconductor layer having not been covered with the mask member.

According to such a manufacturing method, particularly a method of manufacturing a current confinement structure, better insulating properties of a current non-injection region or a current confinement region on the surface of the p-side semiconductor layer can be secured without causing current concentration on a lateral surface of a projection processed in order to form the current non-injection region or current confinement region or deterioration of the insulating properties outside the projection, which is attributable to the projection. The life characteristics can thus be improved, and the reliability of the vertical-cavity surface-emitting laser element can be improved.

Provision of Nitride Semiconductor Layer 5

Figure 1A:
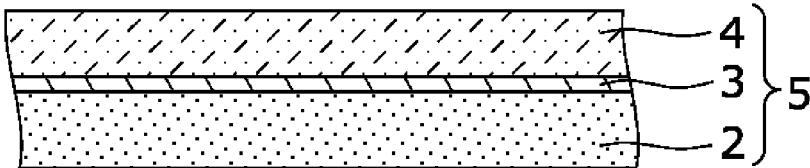
FIG. 1A is a schematic cross-sectional view for illustrating a step in a method of manufacturing a vertical-cavity surface-emitting laser element of one embodiment of the present disclosure, particularly a method of manufacturing a current confinement structure.

A nitride semiconductor layer 5 including an n-side semiconductor layer 2, an active layer 3, and a p-side semiconductor layer 4 layered in this order as shown in FIG. 1A is provided. For example, in the nitride semiconductor layer 5, an n-side semiconductor layer 2 made of an AlIn-GaN compound semiconductor, an active layer 3 made of an AlInGaN compound semiconductor, and a p-side semiconductor layer 4 made of an AlInGaN compound semiconductor are layered in this order. Examples of the AlInGaN compound semiconductor include AlN, InN, GaN, AlGaN, InGaN, AlInN, and AlInGaN. For example, such a nitride semiconductor layer 5 is preferably formed on a first reflective layer 1 as described below.

The n-side semiconductor layer 2 is constituted of a single layer or a multilayer and includes at least one n-type layer doped with an n-type impurity such as Si and Ge. For example, the active layer 3 has a multilayer structure in which a quantum well layer made of InGaN and a barrier layer made of GaN are alternately layered. The number of layers can be appropriately set according to desired characteristics. In addition to GaN, InGaN or the like having a lower In content than in InGaN of the quantum well layer can be used for the barrier layer. The p-side semiconductor layer 4 can include a p-side cladding layer and a p-side contact layer disposed on the p-side cladding layer. The p-side contact layer is a layer doped with a p-type impurity such as Mg. The p-side cladding layer may be a layer doped with the p-type impurity at a lower concentration than in the p-side contact layer or may be an undoped layer. In this case, the p-side contact layer is the uppermost layer of the p-side semiconductor layer 4.

The thickness of each of the n-side semiconductor layer 2, the active layer 3, and the p-side semiconductor layer 4 can be appropriately set. The total thickness from an upper surface of the first reflective layer 1 described below to a lower surface of a second reflective layer 8 is set to an integral multiple of $\lambda/(2n_{eq})$ ($n_{eq}$ is an equivalent refractive index of a waveguide) to generate a standing wave between the surfaces. It is preferable that an antinode of the standing wave be located at the active layer 3 and that a node of the standing wave be located at a light-transmissive p-electrode 6 described below. With such settings, the threshold current can be lowered. The threshold current refers to a minimum current required for laser oscillation.

A surface of the p-side semiconductor layer 4 is preferably a flat surface. When the p-side semiconductor layer has a flat surface as described above, the electrode to be formed on the surface can be disposed to have an even shape, and current concentration attributable to bending of the electrode or the like can be avoided. The term "flat" in the present specification means, for example, that the arithmetic mean roughness of the surface of the A-side semiconductor layer 4 is 0.1 nm to 2 nm. With such a flat surface, the second reflective layer 8 to be described below can also be formed in an even shape.

Covering with Mask Member 16

Figure 1B:
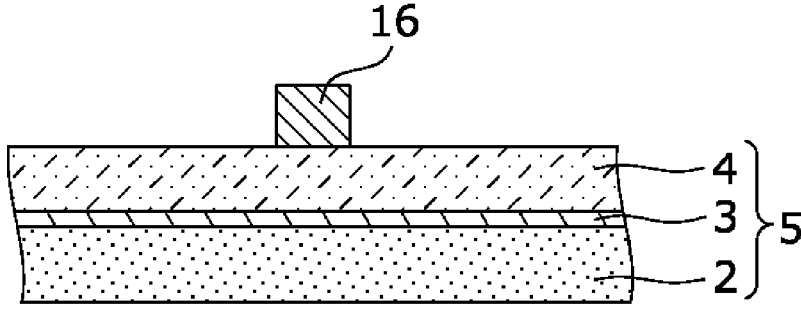
FIG. 1B is a schematic cross-sectional view for illustrating a step in the method of manufacturing a vertical-cavity surface-emitting laser element of one embodiment of the present disclosure, particularly the method of manufacturing a current confinement structure.

At least a portion (example of a first portion) of a surface of the p-side semiconductor layer 4 of the nitride semiconductor layer 5 is covered with a mask member 16 while the other portion (example of a second portion) of the surface of the p-side semiconductor layer 4 of the nitride semiconductor layer 5 is not covered with the mask member 16 as shown in FIG. 1B. The region covered with the mask member 16 is a region to serve as a current injection region for the nitride semiconductor layer 5, and the region not covered with the mask member 16 is a current non-injection region, that is, a current confinement region 4c.

For example, a material layer to be the mask member is formed on an entirety of a surface of the p-side semiconductor layer 4, and patterning is then performed by a photolithography and an etching process known in a relevant technical field, so that the mask member 16 covers at least a portion of the surface of the p-side semiconductor layer 4.

For example, the mask member 16 can be formed of silicon oxide, silicon nitride, silicon oxynitride, or aluminum oxide, and can be preferably formed of silicon nitride. In the case where a non-oxide material such as silicon nitride is used for the mask member 16, oxidation of the current injection region by a heat treatment or the like performed in a subsequent step becomes less likely to occur, so that an increase in the contact resistance can be reduced. The thickness of the mask member 16 can be appropriately adjusted using the material to be formed and is, for example, 0.1 μm or more and 1 μm or less.

For example, the mask member 16 can have various shapes such as a circular shape, an elliptic shape, a polygonal shape including a triangular shape, a quadrilateral shape and a hexagonal shape, and combinations of these shapes in a plan view. Among these shapes, a circular shape and an elliptic shape are preferable. If the mask member has a circular shape or an elliptic shape, the shape of the current confinement region of the resulting vertical-cavity surface-emitting laser element becomes also circular, so that current concentration and the resulting deterioration of the element can be reduced. For example, the size of the mask member is 1 μm or more and 30 μm or less in terms of one side or the diameter, preferably 1 μm or more and 10 μm or less. The position of the mask member can be set to the center of the surface of the p-side semiconductor layer 4 or near the center in a plan view. This structure allows a current to be injected into the nitride semiconductor layer 5 uniformly in a plane.

Figure 1C:
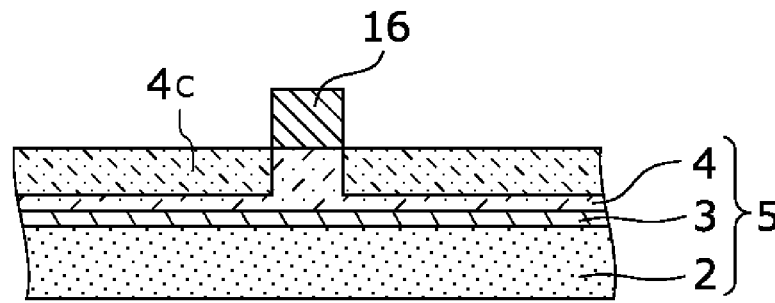
FIG. 1C is a schematic cross-sectional view for illustrating a step in the method of manufacturing a vertical-cavity surface-emitting laser element of one embodiment of the present disclosure, particularly the method of manufacturing a current confinement structure.

After the mask member 16 is formed and before an oxide film 17 described below is formed, a reactive ion etching treatment with an oxygen-containing gas may be performed on an entirety of a surface of the p-side semiconductor layer 4 as shown in FIG. 1C. The reactive ion etching treatment with the oxygen-containing gas does not have to be performed to such a degree that a surface of the p-side semiconductor layer 4 is removed due to, for example, partial removal of the p-side semiconductor layer 4, but it is sufficient that at least the surface condition of the p-side semiconductor layer 4 is changed, such as an increase in the oxygen concentration on the surface of the p-side semiconductor layer 4. Examples of the increase in the oxygen concentration can include a state in which the p-side semiconductor layer 4 is doped with oxygen and a state in which a portion of the p-side semiconductor layer 4 is oxidized. By performing the reactive ion etching treatment with the oxygen-containing gas onto a surface of the p-side semiconductor layer 4, the insulating properties of the current confinement region of the resulting vertical-cavity surface-emitting laser element can be further improved. This is thought to be because, for example, the surface of the p-side semiconductor layer 4 not covered with the mask member 16 is oxidized. The nitride semiconductor may react with oxygen atoms to form an oxide layer to increase the resistance. Also, the surface of the p-side semiconductor layer 4 may be changed by the reactive ion etching treatment with the oxygen-containing gas, which enhances the effectiveness of the subsequent formation of the oxide film 17 and formation of a current confinement region 4b by a heat treatment. For example, the reactive ion etching treatment with the oxygen-containing gas is performed at a bias power within the range of 100 W to 1,000 W and a pressure of 5 Pa to 50 Pa for 30 seconds to 30 minutes in an oxygen atmosphere. The oxygen atmosphere may contain an inert gas such as argon and nitrogen in addition to oxygen. In the case where the reactive ion etching treatment is performed under such conditions, the flatness of the current confinement region 4b can be further enhanced while increasing the resistance of the portion of the surface of the p-side semiconductor layer 4 not covered with the mask member 16. Examples of the oxide layer include $Ga_2O_3$ and GaON depending on the type of the semiconductor to be used. For example, the oxide layer is preferably within the range of 0.5 nm or more and 10 nm or less from the surface of the p-side semiconductor layer 4 in view of securing the insulating properties and good surface flatness.

Formation of Oxide Film 17

Figure 1D:
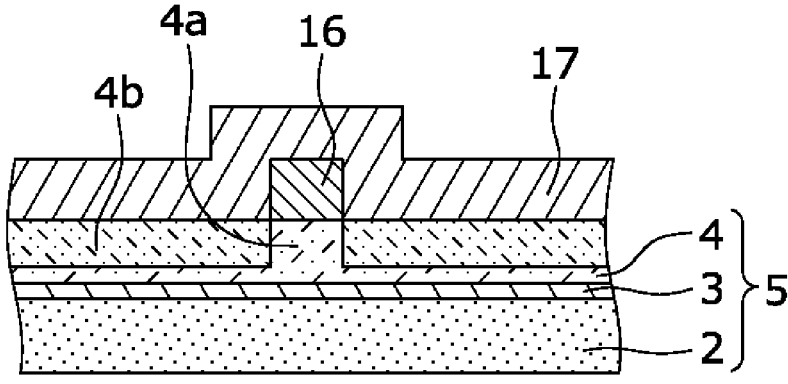
FIG. 1D is a schematic cross-sectional view for illustrating a step in the method of manufacturing a vertical-cavity surface-emitting laser element of one embodiment of the present disclosure, particularly the method of manufacturing a current confinement structure.

The oxide film 17 is formed on the surface of the p-side semiconductor layer 4 over the mask member 16 as shown in FIG. 1D. The oxide film 17 is preferably formed on the entire surface of the p-side semiconductor layer 4. Examples of the oxide film 17 include oxides containing silicon, zinc, gallium, or the like, and among these oxides, a film of an oxide containing at least one of silicon and zinc is preferable. Examples of such an oxide film include a silicon oxide film and a zinc oxide film. For the silicon oxide film, a composite oxide containing silicon such as $SiO_2$ or SiO can be used. The silicon oxide film may contain SiOx in the amorphous state. Examples of the zinc oxide film include composite oxides containing zinc such as indium zinc oxide and gallium zinc oxide in addition to zinc oxide. For example, ZnO, $ZnO_2$, or the like may be used for the zinc oxide film. The zinc oxide film may contain ZnOx in the amorphous state. Among these substances, a film made of $SiO_2$ is preferable in view of ease of removal.

The oxide film 17 can be formed by using a technique known in the relevant technical field. Examples of the technique include sputtering using a target containing an element constituting the above oxide film under an oxygen atmosphere, under an air atmosphere, under an inert gas atmosphere, or under a nitrogen gas atmosphere under reduced pressure or under a vacuum.

The oxide film 17 may include thicker or thinner portions but preferably has a uniform thickness on the surface of the p-side semiconductor layer 4. The thickness of the oxide film 17 can be appropriately adjusted according to the material to be used. For example, the thickness of the oxide film 17 is 50 nm or more and 1,000 nm or less, preferably 100 nm or more and 800 nm or less, more preferably 150 nm or more and 600 nm or less.

Heat Treatment of Nitride Semiconductor Layer 5

The nitride semiconductor layer 5 on which the oxide film 17 covering the mask member 16 on the p-side semiconductor layer 4 has been formed is heat-treated. The heat treatment is performed under an oxygen atmosphere or an air atmosphere at, for example, 500° C. or higher and 800° C. or lower, preferably 550° C. or higher and 750° C. or lower. The time of the heat treatment can be appropriately adjusted according to the temperature and is, for example, 1 minute or more and 60 minutes or less, preferably 2 minutes or more and 30 minutes or less, more preferably 2 minutes or more and 10 minutes or less. Through the heat treatment of the nitride semiconductor layer, oxygen diffuses from the oxide film 17 into the p-side semiconductor layer in the region of the surface of the p-side semiconductor layer 4 in contact with the oxide film 17, and the resistance of the portion into which oxygen has diffused increases to form the current confinement region 4b. By forming the current confinement region 4b by diffusion of oxygen, the region that has been covered with the mask member 16 becomes a region (current injection region 4a) having a relatively low resistance. Accordingly, the insulating properties of the current confinement region can be further enhanced while making the p-side semiconductor layer flat, the vertical-cavity surface-emitting laser element with further improved reliability can be obtained. For example, the current confinement region 4b here is preferably within the range of 0.5 nm or more and 10 nm or less from the surface of the p-side semiconductor layer 4.

Removal of Oxide Film 17 and Mask Member 16

Figure 1E:
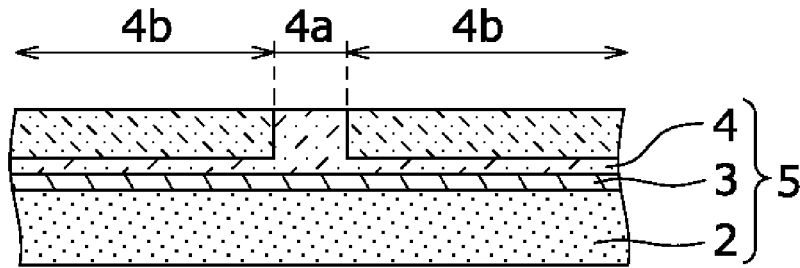
FIG. 1E is a schematic cross-sectional view for illustrating a step in the method of manufacturing a vertical-cavity surface-emitting laser element of one embodiment of the present disclosure, particularly the method of manufacturing a current confinement structure.

After the heat treatment, the oxide film 17 and the mask member 16 are removed from the surface of the nitride semiconductor layer 5 as shown in FIG. 1E. The removal of the oxide film 17 and the mask member 16 may be performed separately or continuously depending on their materials. In either case of separate or continuous removal, the same technique or different techniques may be employed. For the removal of the oxide film 17 and the mask member 16, for example, any appropriate techniques known in the field of the disclosure such as wet etching, dry etching, abrasion, and polishing may be used. Among these techniques, it is preferable to perform the removal by wet etching. Specific examples thereof include a technique of bringing the oxide film 17 and/or the mask member 16 into contact with a removal-treatment liquid. For the removal-treatment liquid used in this technique, a removal-treatment liquid known in the field of the disclosure can be appropriately selected according to the materials, thicknesses, and the like of the oxide film 17 and the mask member 16. The type, concentration, temperature, contact method, and the like of the removal-treatment liquid can be appropriately set. For example, a heated or unheated solution or mixed solution based on one or two or more acids of HCl, phosphoric acid ($H_3PO_4$), nitric acid ($HNO_3$), acetic acid ($CH_3COOH$), aqua regia, hydrofluoric acid (HF) or buffered hydrofluoric acid (BHF), sulfuric acid, or a hydrogen peroxide solution, a solution or mixed solution based on an alkali of tetramethyl ammonium hydroxide (TMAH) or NaOH (sodium hydroxide), or the like prepared at any appropriate concentration can be used for the removal-treatment liquid. Specifically, in the case where the oxide film 17 is made of $SiO_2$, examples include buffered hydrofluoric acid (BHF), and also in the case where the mask member 16 is made of SiN, examples include buffered hydrofluoric acid (BHF). For example, the temperature of the removal-treatment liquid at this time may be 5° C. or higher and 100° C. or lower or may be 10° C. or higher and 80° C. or lower, and examples of the contact method include immersion, dropping, and spraying.

By removing the oxide film 17 and the mask member 16, the current injection region 4a can be formed to be coplanar with the current confinement region 4b on the surface of the p-side semiconductor layer 4. That is, the region extending over the current injection region 4a and the current confinement region 4b can be a flat surface. For example, the terms "coplanar" and "flat" encompasses a difference in height or unevenness of about 2 nm. For example, in the case where a projection is formed on the surface of the p-side semiconductor layer to form the current injection region/the current non-injection region, the electrode disposed on the surface is bent due to the undulation of the projection, so that the current can be concentrated at the bent portion of the electrode. However, when the p-side semiconductor layer has a flat surface over the current injection region 4a and the current confinement region 4b as described above, the current concentration can be reduced, so that breakage of the electrode caused by the current concentration can be reduced. Further, sufficient insulating properties can be ensured.

Formation of Electrode

The electrode is formed on the surface of the nitride semiconductor layer 5 from which the oxide film 17 and the mask member 16 have been removed, that is, over the portion of the surface of the p-side semiconductor layer 4 that has been covered with the mask member 16 and the portion of the surface of the p-side semiconductor layer 4 that has not been covered with the mask member 16 due to disposition of the oxide film 17, in other words, over the current confinement region 4b and the current injection region 4a. The electrode is hereinafter referred to as the p-electrode 6.

A lower surface of the p-electrode 6 is preferably in contact only with the p-side semiconductor layer 4. In other words, the p-electrode 6 is more preferably in contact with the flat p-side semiconductor layer 4 in the region in which the mask member 16 has been formed in the above step, that is, the current injection region 4a and the vicinity of the current injection region 4a. For example, the surface area of the upper surface of the p-electrode 6 can be of such magnitude as to be larger than the surface area of the current injection region 4a and as to allow the outer edge of the p-electrode 6 to be located inside the outer edge of the upper surface of the p-side semiconductor layer 4 in a plan view. This structure facilitates formation of a p-pad electrode 9p so as not to overlap with the second reflective layer 8 in a plan view as described below.

The p-electrode 6 can be formed of a light-transmissive material having a transmittance of light at a peak wavelength of laser light emitted from the vertical-cavity surface-emitting laser element of 60% or more or 70% or more, preferably 90% or more, more preferably 95% or more, still more preferably 99% or more. Examples of the light-transmissive material include a transparent conductive material containing an oxide such as indium tin oxide (ITO) and indium zinc oxide (IZO) as a base material. Specific examples thereof include ITO. Reducing the thickness can reduce absorption of light by the p-electrode 6 but increases the resistance, and an appropriate adjustment can be made considering the balance between the reduction and the increase. The thickness of the p-electrode 6 is, for example, 100 nm or less, preferably 60 nm or less, more preferably 35 nm or less, still more preferably 30 nm or less. The thickness of the p-electrode 6 can be 5 nm or more. Specifically, the thickness of the p-electrode 6 is, for example, 5 nm or more and 100 nm or less, preferably 10 nm or more and 60 nm or less, more preferably 15 nm or more and 35 nm or less, still more preferably 20 nm or more and 30 nm or less. By bringing the thickness of the p-electrode 6 into this range, absorption of light into the p-electrode 6 can be reduced, and the threshold current can be reduced.

Other Steps

The above method of manufacturing a vertical-cavity surface-emitting laser element can include the following steps to form the vertical-cavity surface-emitting laser element. For example, the method includes further forming the first reflective layer under the n-side semiconductor layer of the nitride semiconductor layer including the n-side semiconductor layer, the active layer, and the p-side semiconductor layer in this order, that is, providing a nitride semiconductor layer including the first reflective layer, the n-side semiconductor layer, the active layer, and the p-side semiconductor layer in this order. The method also includes forming the second reflective layer on the surface of the p-side semiconductor layer over the p-electrode. The method further includes forming an electrode (hereinafter may be referred to as an n-electrode) in contact with the n-side semiconductor layer. The method may further include forming an anti-reflection film and bonding to a heat dissipation substrate in addition to these steps.

Formation of First Reflective Layer 1

Figure 2A:
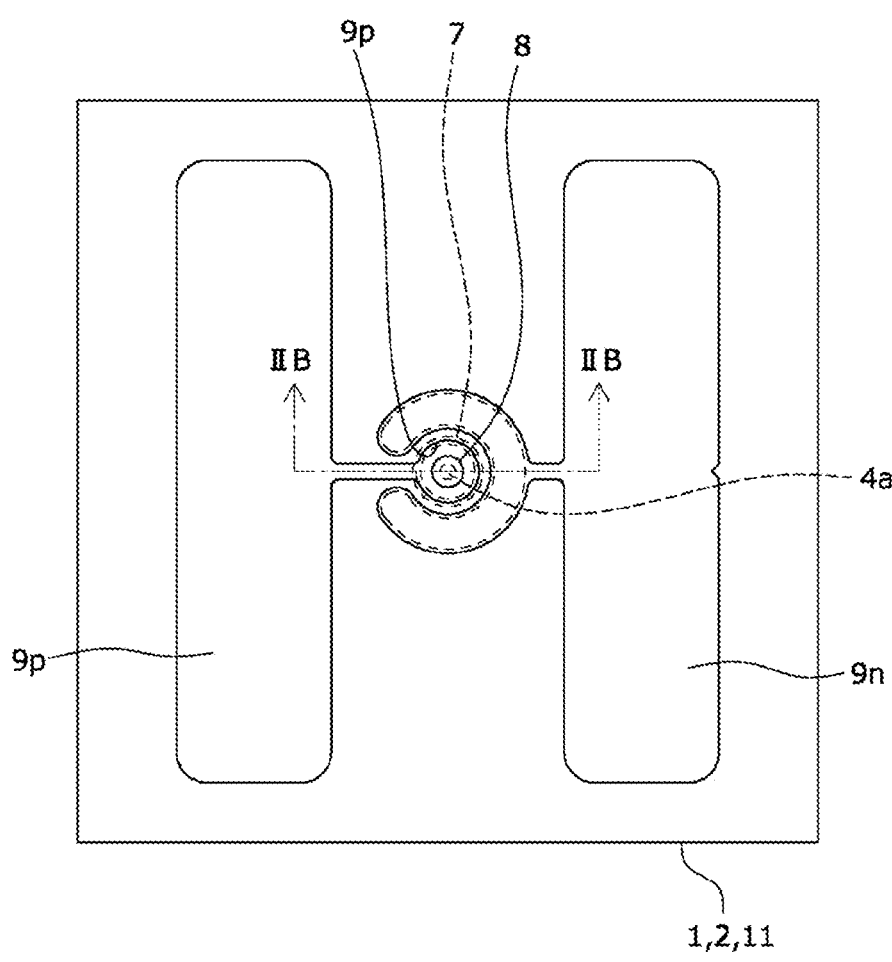
FIG. 2A is a schematic plan view of the vertical-cavity surface-emitting laser element of one embodiment of the present disclosure.
Figure 2B:
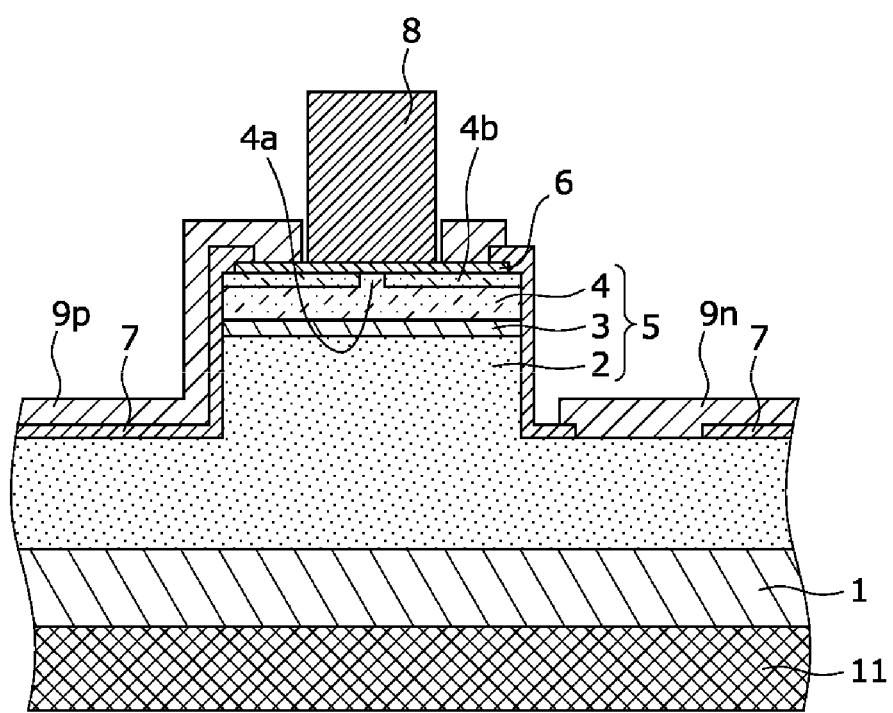
FIG. 2B is a schematic cross-sectional view taken along the line IIB-IIB of FIG. 2A.

The first reflective layer 1 is formed as shown in FIG. 2B. For example, the first reflective layer 1 can be formed before the nitride semiconductor layer 5 described above is formed. That is, it is possible to provide a substrate 11 for semiconductor growth, form the first reflective layer 1 on the substrate 11, and then layer the n-side semiconductor layer 2, the active layer 3, and the p-side semiconductor layer 4 in this order on the upper surface of the first reflective layer 1. Alternatively, the nitride semiconductor layer 5 may be formed on the substrate 11 for semiconductor growth, the substrate 11 for semiconductor growth may be then removed from the nitride semiconductor layer 5, and the first reflective layer 1 may be formed on the surface of the nitride semiconductor layer 5 exposed by the removal. Examples of the substrate 11 for semiconductor growth include nitride semiconductor (such as GaN), sapphire, SiC, and Si substrates.

In order to obtain a desired reflectance, the material constituting each layer, the thickness, the number of layers, and the like of the first reflective layer 1 can be appropriately selected. For example, the first reflective layer 1 can be configured to include a semiconductor multilayer film or a dielectric multilayer film. The first reflective layer 1 can be provided by alternately layering films of two or more types having different refractive indices. Examples of the semiconductor multilayer film include a layer of a nitride semiconductor such as an AlInGaN compound semiconductor. Specific examples include AlN, InN, GaN, AlGaN, InGaN, AlInN, and AlInGaN. Among these materials, the combination of GaN and AlInN lattice-matched to GaN is preferable. Examples of the dielectric multilayer film include an oxide, nitride, or fluoride of Si, Mg, Al, Hf, Nb, Zr, Sc, Ta, Ga, Zn, Y, B, or Ti, and specific examples include $SiO_2/Nb_2O_5$, $SiO_2/Ta_2O_5$, and $SiO_2/Al_2O_3$. The thickness of each layer constituting the multilayer film is $\lambda/(4n)$ (where $\lambda$ is the oscillation wavelength of the laser element, and n is the refractive index of a medium constituting each layer) and can be appropriately set according to the refractive index n of the material used at the oscillation wavelength $\lambda$. Specifically, an odd multiple of $\lambda/(4n)$ is preferable. For example, in the case where the first reflective layer 1 in a light-emitting element having an oscillation wavelength $\lambda$ of 450 nm is constituted of GaN/AlInN, examples of the thickness of each layer is 40 nm or more and 70 nm or less. The number of layers of the multilayer film can be appropriately set according to intended characteristics. Examples of the number of layers of the multilayer film include 2 or more, such as 5 or more and 100 or less. For example, the overall thickness of the first reflective layer 1 can be 0.08 μm or more and 7 μm or less. The size and shape of the first reflective layer 1 can be appropriately designed as long as the light-emitting portion of the laser element is covered.

The substrate 11 for semiconductor growth can be made into a thin substrate by reducing the thickness of the surface opposite to the first reflective layer 1 at an appropriate stage after the first reflective layer 1 and the nitride semiconductor layer 5 are formed. The reducing the thickness of the substrate 11 or removal of the substrate 11 can be performed using an abrasion method, an etching method, or the like known in the field of the disclosure.

Formation of Second Reflective Layer 8

The second reflective layer 8 can be formed on the surface of the p-side semiconductor layer over the p-electrode 6 as shown in FIG. 2B. The second reflective layer 8 may be formed only on the p-electrode 6 or may be formed over the p-electrode 6 and the surface of the p-side semiconductor layer 4. Among these constitutions, formation only on the p-electrode 6 is preferable. In the case where the second reflective layer 8 is formed only on the p-electrode 6, formation of the second reflective layer 8 in an even shape and the control of the shape of the laser light emitted can be facilitated. Alternatively, the second reflective layer 8 can be formed only on the current injection region 4a only on the p-electrode 6, or directly above the current injection region 4a and on the current confinement region 4b in the vicinity of the current injection region 4a. In particular, the second reflective layer 8 can be formed over the current injection region 4a and the current confinement region 4b in the vicinity of the current injection region 4a is preferable. In the case where the second reflective layer 8 is formed over the current injection region 4a and the current confinement region 4b in the vicinity of the current injection region 4a, alignment of the pattern when forming the second reflective layer 8 can be facilitated, and the productivity can be improved. The second reflective layer 8 is located on the upper side of the current injection region 4a, formed on the flat p-electrode 6, and therefore less likely to be affected by the unevenness, so that a uniform reflectance can be secured in a comparatively wide region. Accordingly, the shape of the emitted laser is further stabilized, and the control becomes easier.

For example, the second reflective layer 8 is preferably formed in a region covering the current injection region 4a and the current confinement region 4b in the vicinity of the current injection region 4a, the region having a diameter or a length of one side that is about 10% to 50% larger than the diameter or the length of one side of the current injection region 4a. The second reflective layer 8 can be configured to include a dielectric multilayer film. The second reflective layer 8 can have the same constitution as the dielectric multilayer film illustrated for the first reflective layer 1 described above. Examples include $SiO_2/Nb_2O_5$, $SiO_2/Ta_2O_5$, and $SiO_2/Al_2O_3$. The thickness of each layer is preferably $\lambda/(4n)$ (where $\lambda$ is the oscillation wavelength of the laser element, and n is the refractive index of a medium constituting each layer). The number of layers can be appropriately set according to intended characteristics. Specifically, in the case where the second reflective layer 8 is constituted of $SiO_2/Nb_2O_5$ or the like, examples for each layer include 40 nm or more and 70 nm or less. Examples of the number of layers of the multilayer film include 2 or more, such as 5 or more and 20 or less. The overall thickness of the second reflective layer 8 is, for example, 0.08 μm or more and 2.0 μm or less and can be 0.6 μm or more and 1.7 μm or less.

The second reflective layer 8 is preferably spaced apart from an insulating film 7 described below. In other words, the second reflective layer 8 is preferably disposed so as not to overlap with the insulating film 7 described below in a plan view. The second reflective layer 8 having smaller differences in level can thus be formed.

Formation of n-Electrode 9n, p-Pad Electrode 9p, and Insulating Film 7

An electrode (hereinafter referred to as an n-electrode 9n) in contact with the n-side semiconductor layer 2 is preferably formed as shown in FIGS. 2A and 2B.

In order to achieve the formation, in the surface of the nitride semiconductor layer 5 in the vicinity of the current confinement region 4b, portions of the p-side semiconductor layer 4, the active layer 3, and the n-side semiconductor layer 2 are removed in the thickness direction to partially expose the n-side semiconductor layer 2. That is, after the nitride semiconductor layer 5 is formed, portions of the p-side semiconductor layer 4, the active layer 3, and the n-side semiconductor layer 2 are removed by using a known method such as photolithography and etching to partially expose the n-side semiconductor layer 2. Accordingly, the p-electrode 6 and the n-electrode 9n that supply a current to the laser element can be disposed on the same side of the nitride semiconductor layer 5.

The insulating film 7 is preferably formed on a portion of the exposed n-side semiconductor layer 2 and lateral surfaces of the p-side semiconductor layer 4, the active layer 3, and the n-side semiconductor layer 2. The insulating film 7 may cover the upper surface of the p-side semiconductor layer 4 but is preferably spaced apart from at least the second reflective layer 8 described above. The insulating film 7 can be formed of an inorganic material or the like such as $SiO_x$ materials including $SiO_2$, $SiN_y$ materials such as SiN, $SiO_xN_y$ materials, $Ta_2O_5$, $ZrO_2$, AlN, $Al_2O_3$, and $Ga_2O_3$. The thickness of the insulating film 7 can be appropriately set.

The n-electrode 9n is formed on the exposed n-side semiconductor layer 2. Such a constitution eliminates the need that the current path passes through the first reflective layer 1 and the need to dope the first reflective layer 1 with the n-type impurity, so that the first reflective layer 1 can reflect light at a high reflectance.

The n-electrode 9n can be formed of any of electroconductive materials generally used for electrodes in the field of the disclosure. Examples include Ti/Pt/Au and Ti/Rh/Au. The p-pad electrode 9p may be formed on the p-electrode 6. The p-pad electrode 9p is preferably formed into such a shape as to surround the outer periphery of the current injection region 4a to be in contact with the p-electrode 6. A current can thus be more uniformly injected into the p-side semiconductor layer 4 from the p-pad electrode 9p through the p-electrode 6. The p-pad electrode 9p is preferably spaced apart from the second reflective layer 8. In other words, the p-pad electrode 9p is preferably disposed so as not to overlap with the second reflective layer 8 in a plan view. Not disposing the p-pad electrode 9p directly below the second reflective layer 8 as described above can make the second reflective layer 8 directly above the current injection region flatter.

The p-pad electrode 9p may be formed of the same or different material as or from the material of the n-electrode 9n to have a single-layer structure, may be formed of the same material to have the same multilayer structure, or may be formed of a different material to have a different multilayer structure. In the case where the n-electrode 9n and the p-pad electrode 9p are formed of the same material to have the same multilayer structure, the n-electrode 9n and the p-pad electrode 9p can be formed in the same step.

The p-pad electrode 9p and the n-electrode 9n are preferably formed after the insulating film 7 is formed.
Formation of Anti-Reflection Film 14

Figure 3:
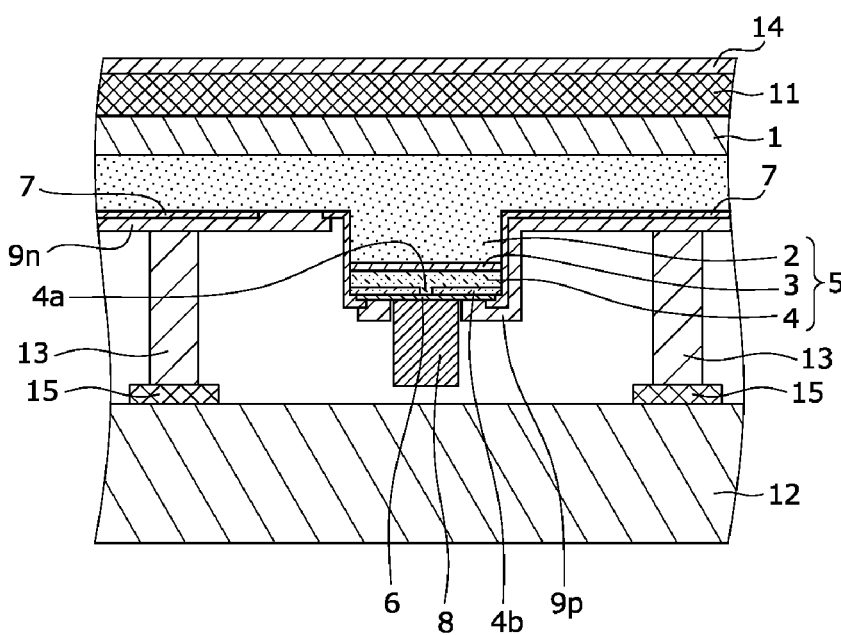
FIG. 3 is a schematic cross-sectional view of a main part showing a modification of the vertical-cavity surface-emitting laser element.

An anti-reflection film 14 may be further formed on the surface of the substrate 11 opposite to the first reflective layer 1 as shown in FIG. 3. In the case where the substrate 11 is completely removed, the anti-reflection film 14 may be formed on the surface of the first reflective layer 1. For the anti-reflection film 14, the same material as the material of the dielectric multilayer film illustrated for the first reflective layer 1 described above can be used. Examples of the thickness of the anti-reflection film 14 include 0.1 μm or more and 5 μm or less.
Bonding to Heat Dissipation Substrate 12

The resulting nitride semiconductor layer 5 can be bonded to a heat dissipation substrate 12 provided with a metal film 15 with a bonding layer 13 interposed between the nitride semiconductor layer 5 and the heat dissipation substrate 12 as shown in FIG. 3. The bonding layer 13 can be disposed so as to be bonded to each of the p-pad electrode 9p and the n-electrode 9n and to each metal film 15 of the heat dissipation substrate 12. The space between the heat dissipation substrate 12 and the resulting nitride semiconductor layer 5, that is, the region of the nitride semiconductor layer 5 other than the region in which the bonding layer 13 is disposed, may remain hollow, or embedding can be performed using an insulating heat dissipation member or the like. The bonding of the nitride semiconductor layer 5 to the heat dissipation substrate 12 may be performed before reducing the thickness of the substrate 11 and the like and/or formation of the anti-reflection film 14. The formation of the first reflective layer 1 may be performed after the formation of the second reflective layer 8. For example, it is possible to remove a portion or the whole of the substrate 11 and form the first reflective layer 1 on the surface exposed by the removal.

Examples of the heat dissipation substrate 12 include a ceramic such as AlN, a semiconductor substrate made of a semiconductor such as SiC, a single-component metal substrate, and a metal substrate made of a composite of two or more metals. For example, a substrate that is made of an insulating AN ceramic as a base material and includes a plurality of metal films 15 formed on the surface of the base material can be used as the heat dissipation substrate 12. Each of the metal films 15 is electrically connected to a respective one of the p-pad electrode 9p and the n-electrode 9n. An electroconductive substrate such as a metal substrate may be used as the heat dissipation substrate 12 in the case where the p-electrode and the n-electrode are not required to both electrically connected to the heat dissipation substrate 12 such as the case where the p-pad electrode 9p and the n-electrode 9n are disposed with the nitride semiconductor layer 5 interposed therebetween and the case where the first reflective layer 1 side is bonded to the heat dissipation substrate 12. Examples of the thickness of the heat dissipation substrate 12 include 50 μm or more and 500 μm or less. A method generally used in the field of the disclosure can be employed as the method of forming the heat dissipation substrate 12.

Test Example A1

In order to evaluate the insulating properties of the current confinement region formed particularly by the method of manufacturing a current confinement structure in the method of manufacturing a vertical-cavity surface-emitting laser element described above, a structure shown in FIG. 4 including a p-side semiconductor layer 4 made of GaN and a pair of light-transmissive p-electrodes 6 made of ITO was formed. The p-side semiconductor layer 4 had the current confinement region 4b at the surface as described above. The current confinement region 4b was formed on the basis of the method shown in FIGS. 1A, 1D, and 1E, and the pair of p-electrodes 6 were formed to be in contact with the upper surface of the current confinement region 4b.

That is, the p-side semiconductor layer 4 (p-GaN layer) was formed on a GaN substrate 11, and an oxide film 17 made of $SiO_2$ with a thickness of 300 nm was formed on the p-side semiconductor layer 4. After that, a heat treatment was performed at a temperature of 700° C. for 5 minutes under a nitrogen atmosphere. Subsequently, the oxide film 17 was removed using a BHF solution to expose the surface of the p-side semiconductor layer 4. The exposed surface of the p-side semiconductor layer 4 was regarded as the current confinement region 4b. The pair of p-electrodes 6 (ITO films, thickness: 200 nm) were formed on the current confinement region 4b by sputtering. In this structure, a voltage was applied from probes 18 through the pair of p-electrodes 6 at room temperature, and the I-V characteristics were evaluated.

Test Example A2

A current confinement region 4b provided with a pair of p-electrodes 6 was formed in the same manner as in Test Example A1 except that the current confinement region 4b was formed by a method based on the method shown in FIGS. 1A, 1C, 1D, and 1E, that is, a reactive ion etching treatment with an oxygen-containing gas was performed as a step based on FIG. 1C after the p-side semiconductor layer 4 was formed and before formation of the oxide film 17, and the I-V characteristics were evaluated in the same manner as in Test Example A1.

The reactive ion etching treatment with the oxygen-containing gas in FIG. 1C was performed under an oxygen atmosphere under the conditions of a bias power of 500 W and a pressure of 8 Pa.

Comparative Example A1

Figure 4:
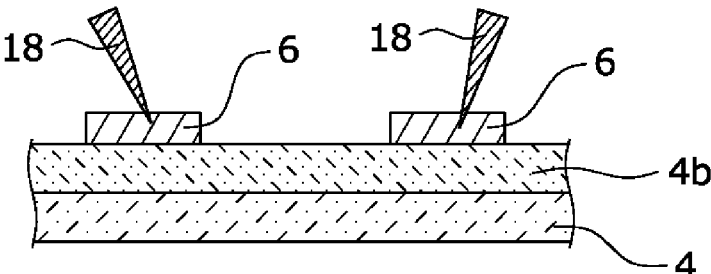
FIG. 4 is a schematic cross-sectional view of a structure for evaluating I-V characteristics of the current confinement structure.
Figure 5A:
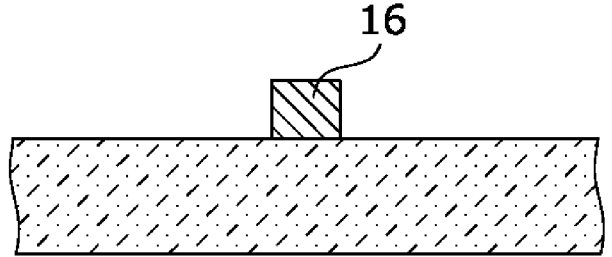
FIG. 5A is a schematic manufacturing process diagram showing a method of manufacturing an evaluation structure of Comparative Example A1.
Figure 5B:
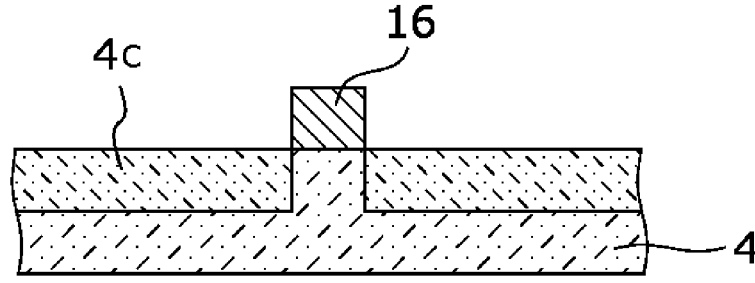
FIG. 5B is a schematic manufacturing process diagram showing the method of manufacturing an evaluation structure of Comparative Example A1.
Figure 5C:
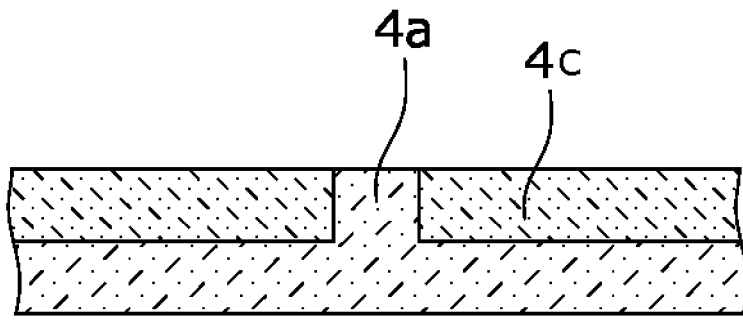
FIG. 5C is a schematic manufacturing process diagram showing the method of manufacturing an evaluation structure of Comparative Example A1.
Figure 5D:
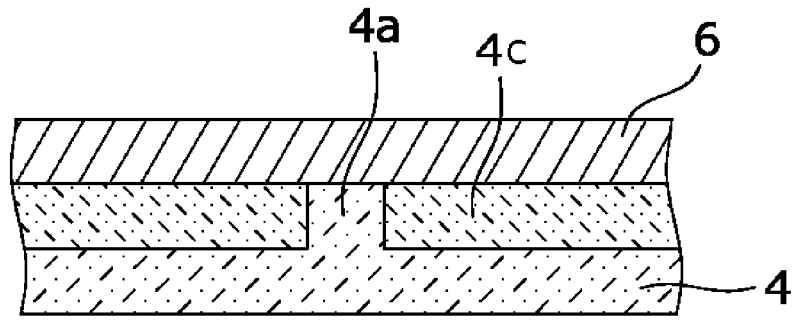
FIG. 5D is a schematic manufacturing process diagram showing the method of manufacturing an evaluation structure of Comparative Example A1.
Figure 6A:
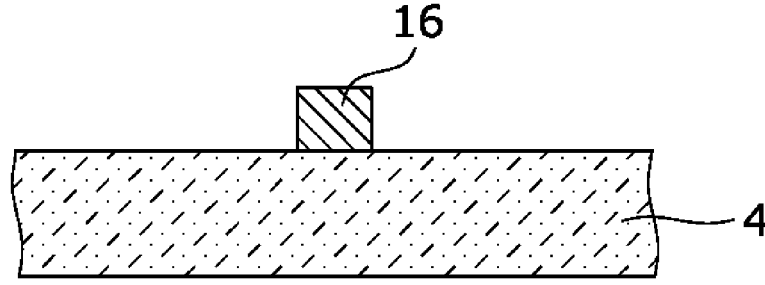
FIG. 6A is a schematic manufacturing process diagram showing a method of manufacturing an evaluation structure of Comparative Example A2.
Figure 6B:
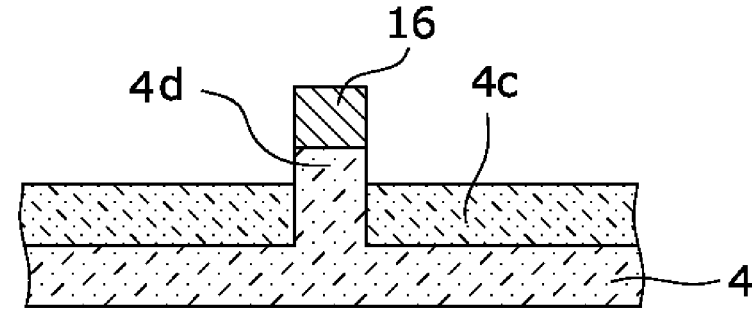
FIG. 6B is a schematic manufacturing process diagram showing the method of manufacturing an evaluation structure of Comparative Example A2.
Figure 6C:
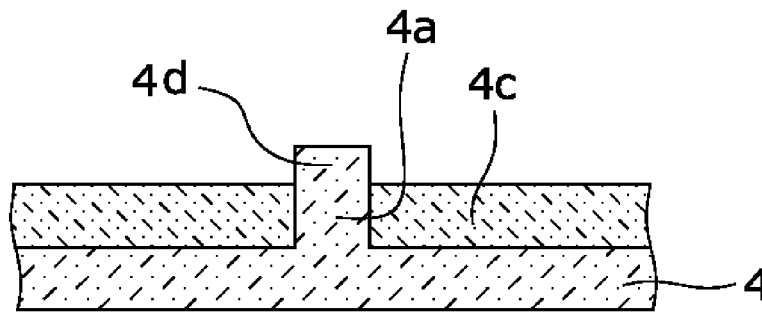
FIG. 6C is a schematic manufacturing process diagram showing the method of manufacturing an evaluation structure of Comparative Example A2.
Figure 6D:
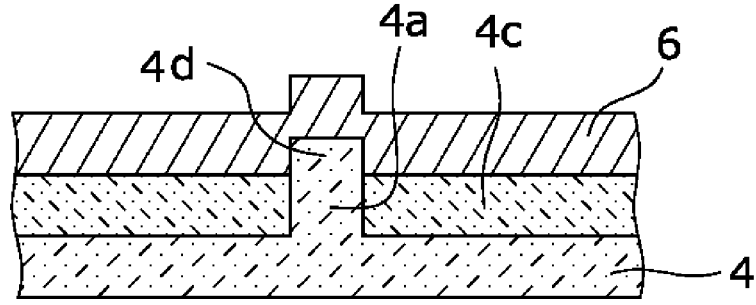
FIG. 6D is a schematic manufacturing process diagram showing the method of manufacturing an evaluation structure of Comparative Example A2.

As Comparative Example A1, a comparative example assuming formation of a vertical-cavity surface-emitting laser element using a method based on a method shown in FIGS. 5A to 5D. However, in the test of Comparative example A1, a configuration as shown in FIG. 4 was employed in order to evaluate insulating properties, and thus the current confinement region 4b was not formed. Therefore, specifically, formation of the mask member shown in FIG. 5A and accompanying removal of the mask member in FIG. 5C were not performed, and a configuration as shown in FIG. 4 was formed through steps to be described below. A reactive ion etching treatment with an oxygen-containing gas (conditions: under an oxygen atmosphere, a bias power of 500 W, a pressure of 8 Pa) was performed as a step based on FIG. 5B on the p-side semiconductor layer 4 used in Test Example A1 to form a current confinement region 4c on the surface of the p-side semiconductor layer 4, p-electrodes 6 were formed as a step based on FIG. 5D, and the I-V characteristics were evaluated in the same manner as in Test Example A1.

Comparative Example A2

A current confinement structure having a projection 4d is known as a prior art, the projection 4d being formed by etching to remove a portion of the surface of a p-side semiconductor layer to increase the resistance as shown in FIG. 6A to 6D. Therefore, in order to evaluate that current confinement structure, formation was performed by a method based on a method shown in FIG. 6A to 6D as Comparative Example A2. As a step based on FIG. 6B, reactive ion etching using a $SiCl_4$ gas was performed on the p-side semiconductor layer 4 used in Test Example A1 to remove a thickness of 6 nm from the surface of the p-side semiconductor layer 4, that is, to remove a semiconductor layer containing GaN doped with the p-type impurity at a high concentration near the surface of the p-side semiconductor layer 4. In Comparative Example A2, a Schottky barrier was formed between the surface after the removal and an ITO electrode by removing GaN doped with the p-type impurity at a high concentration to form the current confinement structure. After that, p-electrodes 6 were formed in a step based on FIG. 6D, and the I-V characteristics were evaluated in the same manner as in Test Example A1.

The I-V characteristics of each of Test Examples A1 and A2 and Comparative Examples A1 and A2 showed insulating properties, and the voltage at 10 μA was evaluated as the threshold voltage. The results were 2.9 V in Test Example A1 and 4.5 V in Test Example A2. On the other hand, the results were 1.2 V in Comparative Example A1 and 2.0 V in Comparative Example A2.

These results showed that Test Example A1, that is, the current confinement region formed by the method of manufacturing a vertical-cavity surface-emitting laser element of the present disclosure, showed better insulating properties than in Comparative Example A2 in which insulation was achieved by the etching treatment of the vicinity of the surface of the A-side semiconductor layer because the heat treatment step was performed after the oxide film was formed in Test Example A1. It was also confirmed that Comparative Example A1 in which only the reactive ion etching treatment with the oxygen-containing gas was performed provided good insulating properties. It was also confirmed that the threshold voltage could be improved to 4.5 V by using the reactive ion etching treatment with the oxygen-containing gas in combination as in Test Example A2.

Through the following procedure, vertical-cavity surface-emitting laser elements having current confinement regions 4b or 4c were produced as Example B1 and Comparative Example B1, and an energization test was performed at room temperature to evaluate the I-L characteristics. The energization test condition was such that a forward current of 15 mA was kept flowing at room temperature. The I-L characteristics before the current was allowed to flow (after 0 minutes) and 1 minute, 5 minutes, and 10 minutes after the start of the flowing were determined.

Example B1

Figure 1F:
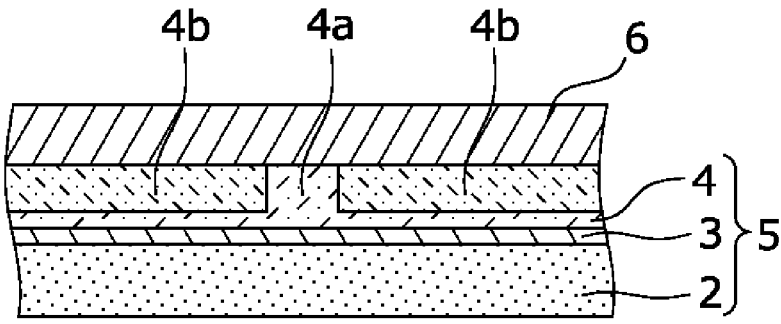
FIG. 1F is a schematic cross-sectional view for illustrating a step in the method of manufacturing a vertical-cavity surface-emitting laser element of one embodiment of the present disclosure, particularly the method of manufacturing a current confinement structure.
Figure 7A:
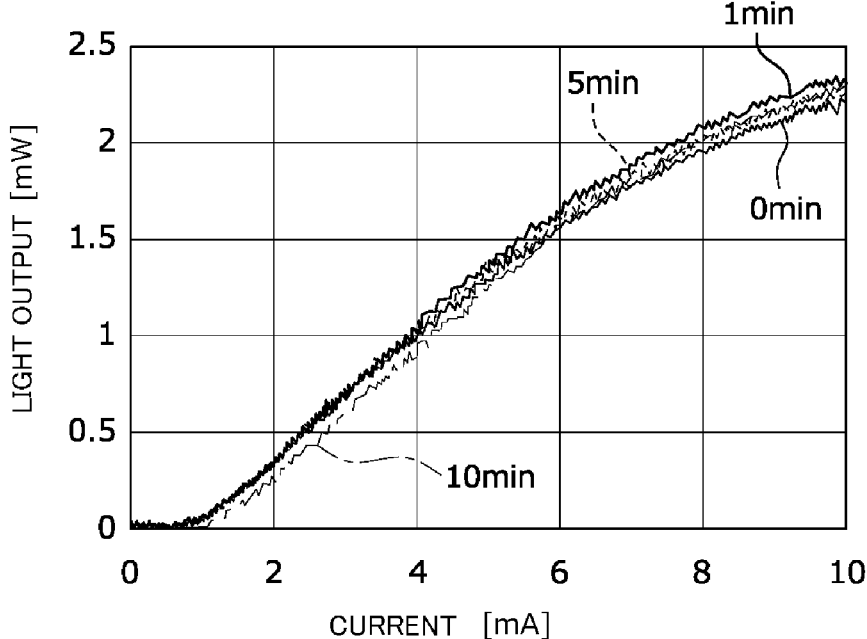
FIG. 7A is a graph showing evaluation results of the I-L characteristics of an element obtained by a method of manufacturing a vertical-cavity surface-emitting laser element of Example B1.

A current confinement region 4b of Example B1 was formed by the method shown in FIGS. 1A to 1F. A first reflective layer 1 made of an $Al_{0.8}In_{0.2}N/GaN$ multilayer film, an n-side semiconductor layer 2, an active layer 3, and a p-side semiconductor layer 4 were formed on a substrate 11, a mask member 16 (diameter: 5 μm, thickness: 500 nm) made of SiN was formed on the product (FIG. 1B), and a reactive ion etching treatment with an oxygen gas was performed to oxidize the surface (FIG. 1C). After that, an oxide film 17 made of a $SiO_2$ film with a thickness of 300 nm was formed on the mask member 16, and a heat treatment was performed under a nitrogen atmosphere at a temperature of 700° C. for 5 minutes (FIG. 1D). Subsequently, the oxide film 17 was removed together with the mask member 16 using a BHF solution to expose the surface of the p-side semiconductor layer 4 (FIG. 1E). As for the exposed p-side semiconductor layer 4, the region that had been covered with the mask member 16 served as the current injection region 4a, and the region that had been in contact with the oxide film 17 served as the current confinement region 4b. A p-electrode 6 (ITO film, thickness: 30 nm) was formed over the current confinement region 4b and the current injection region 4a (FIG. 1F). A second reflective layer 8 made of $SiO_2/Nb_2O_5$ was then formed. The p-side semiconductor layer 4, the active layer 3, and the n-side semiconductor layer 2 were partially removed to expose the n-side semiconductor layer 2 in a region, and an insulating film 7, an n-electrode 9n, and a p-pad electrode 9p were then formed to produce a vertical-cavity surface-emitting laser element shown in FIG. 2B. FIG. 7A shows the results of the I-L characteristics.

Comparative Example B1

Figure 7B:
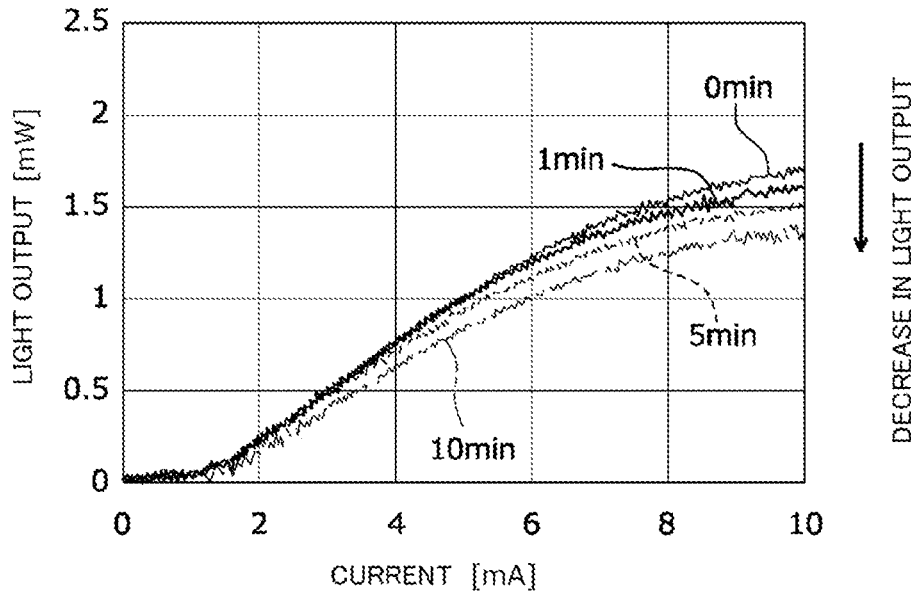
FIG. 7B is a graph showing evaluation results of the I-L characteristics of an element obtained by a method of manufacturing a vertical-cavity surface-emitting laser element of Comparative Example B1.

A vertical-cavity surface-emitting laser element was produced in the same manner as in Example B1 except that a current confinement region 4c was formed in the method shown in FIGS. 5A to 5D, an energization test was performed in the same manner as in Example B1, and the I-L characteristics were evaluated. FIG. 7B shows the results of the I-L characteristics.

The results confirmed that deterioration of the light output over energization time was reduced in Example B1 as shown in FIG. 7A. On the other hand, deterioration of the light output over energization time was observed in Comparative Example B1 as shown in FIG. 7B.

The present application includes the following disclosure.

(1) A method of manufacturing a vertical-cavity surface-emitting laser element, comprising: providing a nitride semiconductor layer comprising an n-side semiconductor layer, an active layer, and a p-side semiconductor layer in this order; covering at least a portion of a surface of the p-side semiconductor layer with a mask member; forming an oxide film on the surface of the p-side semiconductor layer over the mask member; heat-treating the nitride semiconductor layer and the oxide film; removing the oxide film and the mask member that are heat-treated; and forming an electrode extending over the portion of the surface of the p-side semiconductor layer having been covered with the mask member and a portion of the surface of the p-side semiconductor layer having not been covered with the mask member.

(2) The method according to (1), wherein the oxide film comprises an oxide comprising at least one of silicon and zinc.

(3) The method according to (1) or (2), wherein the heat treatment is performed at 500° C. or higher and 800° C. or lower.

(4) The method according to any one of (1) to (3), wherein the oxide film is formed by sputtering.

(5) The method according to any one of (1) to (4), wherein the oxide film is removed by bringing the oxide film into contact with a removal-treatment liquid.

(6) The method according to any one of (1) to (5), wherein the mask member is removed when the oxide film is removed by bringing the oxide film into contact with the removal-treatment liquid.

(7) The method according to any one of (1) to (6), wherein a reactive ion etching with an oxygen-containing gas is performed on an entire surface of the p-side semiconductor layer after the mask member is formed and before the oxide film is formed.

(8) A method of manufacturing a vertical-cavity surface-emitting laser element, comprising: providing a nitride semiconductor layer comprising a first reflective layer, an n-side semiconductor layer, an active layer, and a p-side semiconductor layer in this order; covering at least a portion of a surface of the p-side semiconductor layer with a mask member; forming an oxide film on the surface of the p-side semiconductor layer over the mask member; heat-treating the nitride semiconductor layer and the oxide film; removing the oxide film and the mask member that are heat-treated; forming an electrode extending over the portion of the surface of the p-side semiconductor layer having been covered with the mask member and a portion of the surface of the p-side semiconductor layer having not been covered with the mask member; and forming a second reflective layer on the surface of the A-side semiconductor layer including the electrode.

(9) The method according to (8), the oxide film including an oxide containing at least one of silicon and zinc.

What is claimed is:

1. A method of manufacturing a vertical-cavity surface-emitting laser element, comprising:

providing a nitride semiconductor layer including an n-side semiconductor layer, an active layer, and a p-side semiconductor layer in this order;

covering at least a first portion of a surface of the p-side semiconductor layer with a mask member while a second portion of the surface of the p-side semiconductor layer is not covered with the mask member;

16 forming an oxide film on the second portion of the surface of the p-side semiconductor layer and the mask member;

heat-treating the nitride semiconductor layer and the oxide film;

removing the oxide film and the mask member after the heat-treating of the nitride semiconductor layer and the oxide film; and forming an electrode extending over the first portion and the second portion of the surface of the p-side semiconductor layer.

2. The method according to claim 1, wherein
the oxide film includes an oxide including at least one of silicon and zinc.

3. The method according to claim 1, wherein
the heat-treating of the nitride semiconductor layer and the oxide film is performed at 500° C. or higher and 800° C. or lower.

4. The method according to claim 2, wherein
the heat-treating of the nitride semiconductor layer and the oxide film is performed at 500° C. or higher and 800° C. or lower.

5. The method according to claim 1, wherein
the forming of the oxide film includes forming the oxide film by sputtering.

6. The method according to claim 4, wherein
the forming of the oxide film includes forming the oxide film by sputtering.

7. The method according to claim 1, wherein
the removing of the oxide film includes bringing the oxide film into contact with a removal-treatment liquid.

8. The method according to claim 6, wherein
the removing of the oxide film includes bringing the oxide film into contact with a removal-treatment liquid.

9. The method according to claim 7, wherein
the removing of the mask member includes removing the mask member when the oxide film is removed by bringing the oxide film into contact with the removal-treatment liquid.

10. The method according to claim 8, wherein
the removing of the mask member includes removing the mask member when the oxide film is removed by bringing the oxide film into contact with the removal-treatment liquid.

11. The method according to claim 1, further comprising
performing a reactive ion etching with an oxygen-containing gas on an entire surface of the p-side semiconductor layer after the forming of the mask member and before the forming of the oxide film.

12. The method according to claim 10, further comprising
performing a reactive ion etching with an oxygen-containing gas on an entire surface of the p-side semiconductor layer after the forming of the mask member and before the forming of the oxide film.

13. A method of manufacturing a vertical-cavity surface-emitting laser element, comprising:

providing a nitride semiconductor layer including a first reflective layer, an n-side semiconductor layer, an active layer, and a p-side semiconductor layer in this order;

covering at least a first portion of a surface of the p-side semiconductor layer with a mask member while a second portion of the surface of the p-side semiconductor layer is not covered with the mask member;

forming an oxide film on the second portion of the surface of the p-side semiconductor layer and the mask member;

heat-treating the nitride semiconductor layer and the oxide film;

removing the oxide film and the mask member after the heat-treating of the nitride semiconductor layer and the oxide film;

forming an electrode extending over the first portion and the second portion of the surface of the p-side semiconductor layer; and forming a second reflective layer over the surface of the p-side semiconductor layer including the electrode.

14. The method according to claim 13, wherein the oxide film includes an oxide containing at least one of silicon and zinc.

* * * * *